United States Patent
Wortberg (10) Patent No.: US 11,955,790 B2
(45) Date of Patent: Apr. 9, 2024

(54) ELECTRONIC FUSE CIRCUIT

(71) Applicant: Lisa Draexlmaier GmbH, Vilsbiburg (DE)

(72) Inventor: Michael Wortberg, Dorfen (DE)

(73) Assignee: Lisa Draexlmaier GmbH (DE)

( * ) Notice: Subject to any disclaimer, the term of this patent is extended or adjusted under 35 U.S.C. 154(b) by 16 days.

(21) Appl. No.: 17/748,349

(22) Filed: May 19, 2022

(65) Prior Publication Data
US 2022/0376486 A1 Nov. 24, 2022

(30) Foreign Application Priority Data

May 20, 2021 (DE) ...................... 10 2021 113 107.3

(51) Int. Cl.
| | |
|---|---|
| H02H 3/24 | (2006.01) |
| H02H 3/08 | (2006.01) |
| H02H 3/087 | (2006.01) |
| H03K 17/082 | (2006.01) |
| B60R 16/03 | (2006.01) |

(52) U.S. Cl.
CPC ............ *H02H 3/243* (2013.01); *H02H 3/085* (2013.01); *H02H 3/087* (2013.01); *H02H 3/24* (2013.01); *H03K 17/0822* (2013.01); *B60R 16/03* (2013.01)

(58) Field of Classification Search
CPC ...... B60R 16/02–0207; B60R 16/0215; B60R 16/03; H02H 3/24; H02H 3/243
See application file for complete search history.

(56) References Cited

U.S. PATENT DOCUMENTS

| | | | |
|---|---|---|---|
| 2010/0254059 A1 | 10/2010 | Higuchi et al. | |
| 2012/0146614 A1* | 6/2012 | Takahashi | H02J 7/0031 323/311 |
| 2018/0287365 A1* | 10/2018 | Djelassi-Tscheck | H02H 3/085 |
| 2019/0140438 A1* | 5/2019 | Schiemann | H02H 3/087 |

FOREIGN PATENT DOCUMENTS

| | | |
|---|---|---|
| DE | 112008003096 | 10/2010 |
| DE | 102015108009 | 11/2015 |
| DE | 102018105826 | 9/2019 |

OTHER PUBLICATIONS

Office Action issued in corresponding DE Application 102021113107.3, dated Mar. 30, 2022, 7 pages.

* cited by examiner

*Primary Examiner* — Jared Fureman
*Assistant Examiner* — Christopher J Clark
(74) *Attorney, Agent, or Firm* — BURRIS LAW, PLLC (57) ABSTRACT

An electronic fuse circuit for safeguarding a multi-channel electronic power distributor includes a driver circuit for each channel of the power distributor configured to control an electronic switch of a corresponding channel to assume a certain state, and a microcontroller interface configured to receive from a microcontroller a command for setting the state of the electronic switch of a corresponding channel. The driver circuit of the corresponding channel is configured to set the state of the electronic switch of the corresponding channel according to the command from the microcontroller. The electronic fuse circuit further includes a safety circuit for detecting a malfunction in the microcontroller and/or the power distributor. In the event of a detected malfunction in the microcontroller and/or the power distributor, the driver circuit of each channel is configured to set the state of the electronic switch of the corresponding channel according to a channel-specific preconfigured safety state.

14 Claims, 4 Drawing Sheets

ELECTRONIC FUSE CIRCUIT

CROSS-REFERENCE TO RELATED APPLICATIONS

This application claims priority to and the benefit of German Patent Application No. DE 10 2021 113 107.3, filed on May 20, 2021. The disclosures of the above applications are incorporated herein by reference.

FIELD

The present disclosure relates to an electronic fuse circuit for safeguarding a multi-channel electronic power distributor.

BACKGROUND

The statements in this section merely provide background information related to the present disclosure and may not constitute prior art.

In conventional vehicles, the safeguarding is effected in the electrical system via fuses. These have the property that they can protect lines, but not in a reactionless manner. The current that is necessary to trigger a fuse can be so high that the voltage in the electrical system collapses and safety-critical functions malfunction due to undervoltage. The reaction-lessness (with respect to "disconnect overload," i.e., overload cut-off) of non-safety-critical load paths therefore inherits the integrity requirements of the "provide supply" (i.e., the providing of the power supply) for safety-critical functions. The propagation or spread of faults stemming from QM (quality management) electrical system participants having the classification ASIL B ("Automotive Safety Integrity Level B" corresponding to a recommended failure probability of less than $10^{-7}$ per hour for the function or the safety target) should be avoided.

In the direct supplying of safety-critical functions, the technical safety requirement according to the "provide supply" comes directly into effect. Here the connection in an electronic power distributor should not be interrupted in an implausible manner.

The required integrity for safety-critical functions is typically ASIL D ("Automotive Safety Integrity Level D" corresponding to a required failure probability of less than $10^{-8}$ per hour for the function or for the safety target). For two redundant supply branches the ASIL D is broken down to two ASILs B(D).

SUMMARY

This section provides a general summary of the disclosure and is not a comprehensive disclosure of its full scope or all of its features.

The present disclosure provides a concept for the safeguarding in the electrical system of vehicles that fulfills the above-described safety requirements.

In one form, the present disclosure includes a design for an electronic fuse circuit that supports an electronic switching and safeguarding with the integrity of ASIL B.

In one form, the disclosure is based on the idea of using an electronic safety circuit (also referred to in this disclosure as "electronic fuse ASIC" (EFASIC) as the mixed-signal front end of a microcontroller (µC), in order to implement a rapid controlling of an electronic power distributor that can fulfill the safety requirements.

The electronic fuse ASIC (EFASIC) can be used as a mixed-signal front end for a µC with DSP kernel or at least ALU. Using this mixed signal front end, a µC including an EFASIC can control, in one form, 4 MOSFETs (metal oxide semiconductor field-effect transistors) or electronic switches generally. The EFASIC can be connected to the µC via an SPI (serial peripheral interface) or a similar processor bus. Via a µC, n×4, e.g., 80 channels with MOSFETs can thus be controlled. Trench FETs that have a low RDSon, i.e., drain-source resistance in the switched-on state (in comparison to smart FETs), can typically be used as MOSFETs.

Such an electronic fuse ASIC (EFASIC) can be implemented in a simple and cost-effective manner, since on the one hand MOSFETs with very low RDSon are available, and their costs per current-carrying capacity steadily decrease, and on the other hand the computational power of modern microcontrollers is ever increasing, and cost-effective microcontrollers are available with dedicated DSP (digital signal processor) kernels.

The electronic safety circuit or the mixed-signal front-end ASIC (EFASIC) presented here for the µC supports electronic switching and safeguarding with the integrity of ASIL B.

In one form, the following requirements are supported:

A) Requirement with respect to "disconnect overload" or overload switching: switching off high transient overcurrents (with high reaction potential); switching off static (slower) overload situations; switching off in the event of undervoltage in the electrical system; availability of the supply according to terminal status.

B) Requirement for a channel of an electronic power distributor with respect to reaction-lessness of QM electrical system participants, ASIL B, Safe State OFF, EOTI ("Emergency Operation Time Interval") for a driving cycle: controlling rapid switching elements (e.g., MOSFETs, via gate drivers); rapid detection and switching-off of transient current overload or short circuit; detecting and switching-off of slow overloads; detecting and switching off in the event of undervoltage; diagnosing and availability of the detection mechanisms for the switching off of static (slow) overload situations, switching off in the event of undervoltage in the electrical system, and the availability of the supply according to ASIL B; diagnosing and availability of the switching-off mechanisms for the switching off of static (slow) overload situations, switching off in the event of undervoltage in the electrical system, and the availability of the supply according to ASIL B; assuming of the safe state OFF in the event of fault.

C) Requirement for the available supplying of critical functions: controlling of the switching element, e.g., MOSFETs via gate drivers; interconnecting MOSFETs according to terminal status; switching off MOSFETs in the event of overcurrent; diagnosing and availability of the switch-off mechanisms for the switching off of stationary (slow) overload situations according to ASIL B; diagnosing and avoiding of erroneous switching off of the mechanisms for the switching off in the event of undervoltage in the electrical system according to ASIL B; assuming of the safe state ON in the event of a fault.

With the electronic safety circuit or EFASIC presented here, the following advantages can be realized: exploitation of the available resources of modern µC and thus implementation of more cost-effective EFASIC without µC kernel or computing unit; exploitation of the very low RDSon and thus the favorable cost per surface ratio of the MOSFETs; very high currents are realizable via a parallel circuit of MOSFETs; savings in the cooling concept since only approximately 50% to 30% of the waste heat is generated in comparison to individual MOSFETs; current measurement without shunt whereby cost savings and waste-heat savings are realizable.

According to one aspect of the present disclosure, an electronic fuse circuit for safeguarding a multi-channel electronic power distributor includes: a driver circuit for each channel of the electronic power distributor, wherein the driver circuit is configured to control an electronic switch of a corresponding channel of the electronic power distributor to assume a certain state; a microcontroller interface that is configured to receive a command for adjusting the state of the electronic switch of a corresponding channel of the electronic power distributor from a microcontroller, wherein the driver circuit of the corresponding channel is configured to set the state of the electronic switch of the corresponding channel of the electronic power distributor according to the command from the microcontroller; and a safety circuit for detecting a malfunction in the microcontroller and/or the electronic power distributor, wherein the driver circuit of each channel is configured to set the state of the electronic switch of the corresponding channel of the electronic power distributor according to a channel-specific, preconfigured safety state in the event of a detected malfunction in the microcontroller and/or the power distributor.

Using such an electronic fuse circuit, the electrical system of vehicles can be efficiently safeguarded in compliance with the required safety regulations. With electronic switching and safeguarding, the electronic fuse circuit supports the classification or integrity ASIL B. The electronic fuse circuit can be efficiently implemented as ASIC, here also referred to as "electronic fuse ASIC" (EFASIC), and can be implemented as a mixed-signal front end of a microcontroller. The electronic fuse circuit can thus ensure a rapid controlling of an electronic power distributor that fulfills the above-described safety requirements.

For each channel the driver circuit can thereby separately transfer the channel of the electronic power distributor into the channel-specific preconfigured safe state if the safety circuit has detected a malfunction in the corresponding channel of the electronic power distributor.

Alternatively, upon detection of a malfunction in a channel of the electronic power distributor, the driver circuit can transfer all channels of the electronic power distributor connected to the electronic fuse circuit into their channel-specific preconfigured safety states.

With detection of a malfunction in the microcontroller, the driver circuit can transfer all channels of the electronic power distributor connected to the electronic fuse circuit into their channel-specific preconfigured safety states.

The channel-specific preconfigured safety state is a state that brings the corresponding channel into a safe state, i.e., a state wherein no overcurrents occur. This is usually the case when the switch of the corresponding channel is separated from the power supply or the electrical system. The channel-specific preconfigured safety state can be different for each channel or the same for all channels of the electronic power distributor, in one form, when all electronic switches of the electronic power distributor are transferred into the OFF state, wherein the corresponding lines are separated from the current supply.

According to one form of the electronic fuse circuit, the driver circuit of a corresponding channel of the electronic power distributor is configured to control a MOSFET transistor of the corresponding channel.

The technical advantage can thus be achieved that the electronic power distributor can be implemented in a cost- and effort-effective manner, using standard components such as MOSFET transistors that are available with low channel resistances.

According to one form of the electronic fuse circuit, the driver circuit of a first channel of the electronic power distributor is configured to control a MOSFET transistor of a first type; and the driver circuit of a second channel of the electronic power distributor is configured to control a MOSFET transistor of a second type.

The technical advantage can thus be achieved that according to ASIL B classification, MOSFETs of different manufacturers can be used with the EFASIC or the electronic fuse circuit. A greater flexibility of the design is thus possible, in one form with respect to cost aspects.

According to one form of the electronic fuse circuit, the driver circuit of a first channel of the electronic power distributor is configured to control a first MOSFET transistor, that is specified for a first line cross-section of an electrical line of the electronic power distributor; and the driver circuit of a second channel of the electronic power distributor is configured to control a second MOSFET transistor that is specified for a second line cross-section of an electrical line of the electronic power distributor.

The technical advantage can thus be achieved that the EFASIC or electronic fuse circuit can control electronic power distributors that include lines to loads of different power requirements, and thus have a different line cross-section. Thus electrical loads not only of the same type, but rather different electrical loads can be connected to the electronic power distributor and controlled by an EFASIC or electronic fuse circuit. A plurality of lines can thus be implemented with very few EFASICs or electronic fuse circuits, which is very cost-efficient.

According to one form of the electronic fuse circuit, the safety circuit comprises a watchdog circuit that is configured to detect a malfunction of the microcontroller based on a receiving of vital-sign signals via the microcontroller interface at prescribed temporal intervals.

The technical advantage can thus be achieved that the microcontroller can be efficiently monitored, and in the event of a fault of the microcontroller, the system can be quickly and efficiently transferred into a safe state.

According to one form of the electronic fuse circuit, the driver circuit of the corresponding channel is configured to determine a transient undervoltage on a voltage supply terminal of the corresponding channel based on a detection of a terminal voltage at the voltage supply terminal, and the safety circuit is configured to switch the electronic switch of the corresponding channel when the terminal voltage falls below a first switch-off threshold value.

The technical advantage can thus be achieved that the electronic fuse circuit can quickly and efficiently detect a transient undervoltage which, in one form, can occur in the event of a short circuit of the electrical system voltage, and allows this voltage to collapse, allowing the system to be transferred into a safe state. In this case the electronic fuse circuit can quickly and safely transfer the system into a safe operating state corresponding to the channel-specific preconfigured safety state.

According to one form of the electronic fuse circuit, the driver circuit of the corresponding channel is configured to receive from the microcontroller, via the microcontroller interface, a static undervoltage at the voltage supply terminal of the corresponding channel that is determined based on a temporal average of the detected terminal voltage; and the driver circuit of the corresponding channel is configured to switch off the MOSFET transistor when the static undervoltage obtained via the microcontroller interface falls below a second switch-off threshold value.

The technical advantage can thus be achieved that in contrast to the transient undervoltage, a static undervoltage can be efficiently detected by the microcontroller using the corresponding detection algorithms. In this case, which is only detected by temporal averaging over a certain time interval, upon command by the microcontroller via the microcontroller interface the electronic fuse circuit can safely transfer the system into the safe operating state.

According to one form of the electronic fuse circuit, the driver circuit of the corresponding channel is configured to transfer the detected terminal voltage at the voltage supply terminal via the microcontroller interface to the microcontroller for the determining of the static undervoltage.

The technical advantage can thus be achieved that the detected terminal voltage is transmitted to the microcontroller, so that it can carry out the corresponding detection algorithms for detecting a static undervoltage.

According to one form of the electronic fuse circuit, the electronic switch of the corresponding channel comprises a MOSFET transistor. The driver circuit of the corresponding channel is configured to determine a transient overload in the corresponding channel based on a detection of a differential voltage of a drain terminal and of a source terminal of the MOSFET transistor. the safety circuit is configured to switch off the MOSFET transistor when the differential voltage exceeds a third switch-off threshold value.

The technical advantage can thus be achieved that the electronic fuse circuit can quickly and efficiently detect a transient overload, which can occur, in one form, when a load having a higher current consumption than specified is connected to the corresponding channel, or when a malfunction is present in the power distributor, in one form a short circuit that leads to a rapidly increasing current flow. In this case the electronic fuse circuit can quickly and safely transfer the system into a safe operating state corresponding to the channel-specific preconfigured safety state.

According to one form of the electronic fuse circuit, the driver circuit of the corresponding channel is configured to receive from the microcontroller, via the microcontroller interface, a static overflow of the corresponding channel that is determined based on an RDSon model of the MOSFET transistor, and the driver circuit of the corresponding channel is configured to switch off the MOSFET transistor when the stationary overcurrent obtained via the microcontroller interface exceeds a fourth switch-off threshold value.

The technical advantage can thus be achieved that in contrast to a transient overcurrent, a static overcurrent can be efficiently determined by the microcontroller using the RDSon model or channel model of the MOSFET transistor. In this case, which is only detected by complex algorithms in the microcontroller upon command by the microcontroller via the microcontroller interface, the electronic fuse circuit can safely transfer the system into the safe operating state.

According to one form of the electronic fuse circuit, the driver circuit of the corresponding channel is configured to transfer the differential voltage of the drain terminal and of the source terminal of the MOSFET transistor for determining the RDSon model to the microcontroller via the microcontroller interface.

The technical advantage can thus be achieved that the differential voltage U_DS between drain and source of the MOSFET transistor is transmitted to the microcontroller so that it can determine the RDSon model.

According to one form of the electronic fuse circuit, the driver circuit of the corresponding channel is configured to detect a housing temperature of the MOSFET transistor of the corresponding channel, and to transfer it to the microcontroller via the microcontroller interface for determining the RDSon model.

The technical advantage can thus be achieved that the housing temperature of the MOSFET transistor is transmitted to the microcontroller, so that it can determine the RDSon model in a manner dependent on the temperature, which makes possible a very precise determining of the static overcurrent.

According to one form of the electronic fuse circuit, the electronic fuse circuit comprises at least one register for the storing of the switch-off threshold values, and the electronic fuse circuit is configured to receive the switch-off values via the microcontroller interface and to store them in the at least one register.

The technical advantage can thus be achieved that the switch-off threshold values can be adaptively set by the microcontroller in order to take into account changing configurations, in one form, of the electronic power distributor.

According to one form of the electronic fuse circuit, the electronic fuse circuit comprises a digital state machine for storing the states of the electronic switches of the respective channels of the electronic power distributor, and the driver circuit of the corresponding channel is configured to correspondingly set the digital state machine during a setting of the state of the electronic switch of the corresponding channel.

The technical advantage can thus be achieved that via the digital state machine the electronic fuse circuit has sufficient information to transfer the electronic power distributor into a safe state in case of fault.

According to another aspect of the present disclosure, a method for safeguarding a multi-channel electronic power distributor includes: controlling of an electronic switch of a corresponding channel of the electronic power distributor to assume a certain state by a driver circuit for each channel of the electronic power distributor, receiving from a microcontroller, via a microcontroller interface, of a command for setting the state of the electronic switch of a corresponding channel of the electronic power distributor, setting of the state of the electronic switch of the corresponding channel of the electronic power distributor by the driver circuit of the corresponding channel, according to the command of the microcontroller, detecting of a malfunction in the microcontroller and/or the electronic power distributor by a safety circuit, and setting of the state of the electronic switch of the corresponding channel of the electronic power distributor by the driver circuit of each channel according to a channel-specific preconfigured safety state when a malfunction is detected in the microcontroller and/or the power distributor.

Using such a method the electrical system of vehicles can be efficiently safeguarded in compliance with the required safety regulations. With electronic switching and safeguarding, the method supports the classification or integrity ASIL B. The electronic fuse circuit can be efficiently implemented as ASIC, here also referred to as "electronic fuse ASIC" (EFASIC), and can be implemented as a mixed-signal front end of a microcontroller. The method can thus ensure a rapid controlling of an electronic power distributor that fulfills the above-described safety requirements. The method can be easily realized as a computer program, and can be carried out, in one form, on the electronic fuse circuit or EFASIC.

According to one aspect of the present disclosure, a computer program includes a program code for executing the method according to another aspect on a control system, in one form on an electronic fuse circuit.

The technical advantage is thus achieved that the computer program can be carried out in a simple manner on a control system, such as, in one form, on the electronic fuse circuit or EFASIC.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

In the following detailed description, reference is made to the accompanying drawings that form a part thereof and in which specific forms are shown as illustration, in which the present disclosure can be embodied. It is understood that other forms can also be used and structural or logical changes can be made without deviating from the concept of the present disclosure. The following detailed description is therefore not to be understood in a limiting sense. It is further understood that the features of the various exemplary forms described herein can be combined with one another unless specifically indicated otherwise.

The aspects, variations, or forms are described with reference to the drawings, wherein identical reference numbers relate in general to the same elements. In the following description, numerous specific details are presented for explanatory purposes in order to convey a detailed understanding of one or more aspects, variations or forms of the present disclosure. However, for a person skilled in the art it can be obvious that one or more aspects, variations, or forms can be embodied having a lower degree of the specific details. In other cases, known structures and elements are depicted in schematic form in order to facilitate the describing of one or more aspects, variations or forms. It is understood that other forms, variations, or aspects can be used and structural or logical changes can be made without deviating from the concept of the present disclosure.

In this disclosure, criteria and requirements for functional safety (FUSI) in vehicles are described. Functional safety refers to the part of the safety of a system that depends on the correct function of the safety-related system and other risk-mitigating measures. In the automotive field, functional safety is usually described in the form of ASIL ("Automotive Safety Integrity Level") classes. The ASIL classification is composed of various factors: these are 1) "Severity—S" corresponding to the severity of the fault, the danger to the user or the environment, 2) "Exposure—E" corresponding to the probability of occurrence, i.e., frequency and/or duration of the operating state, 3) "Controllability—C" corresponding to the controllability of the fault. Four different ASIL levels arise from these factors: ASIL A: recommended probability of failure less than $10^{-6}$/hour, ASIL B: recommended probability of failure less than $10^{-7}$/hour, ASIL C: probability of failure less than $10^{-7}$/hour, ASIL D: probability of failure less than $10^{-8}$/hour.

In this disclosure power distributors are described. A power distributor is a device or an assembly, in one form, on a circuit board, wherein fuse- and switch-elements are housed for the distribution of electricity, primarily in the range of the low-voltage grid. It is found in practically every electrified vehicle or building. From power distributors, electrical lines lead either directly to the consumption points, in one form, to the sensors, the fan, or the interior lighting in the automobile, or to the next subordinate power distributor.

In this disclosure electronic switches are described. An electronic switch, also called an analog switch or semiconductor switch, is a component of an electronic circuit that realizes the function of an electromechanical switch. Here field-effect transistors (FET), in one form, metal-oxide semiconductor FETs, and bipolar transistors as well as diodes can be used. In the broader sense, thyristors and semiconductor relays can also be used as electronic switches.

In this disclosure metal-oxide semiconductor field-effect transistors are described. A metal-oxide semiconductor field-effect transistor (MOSFET) is a design of a transistor belonging to the field-effect transistors with an insulated gate, which is defined by a layer stack made of a metallic gate electrode, a semiconductor, and the oxide dielectric located therebetween. This represents a metal-insulation semiconductor structure. The controlling of the current flow in the semiconductor region between the two electrical terminals drain and source is effected via a control voltage (gate-source voltage) or control potential (gate potential) at a third terminal, the so-called gate. This is electrically insulated from the semiconductor (and thus from drain and source) by a dielectric.

Figure 1:
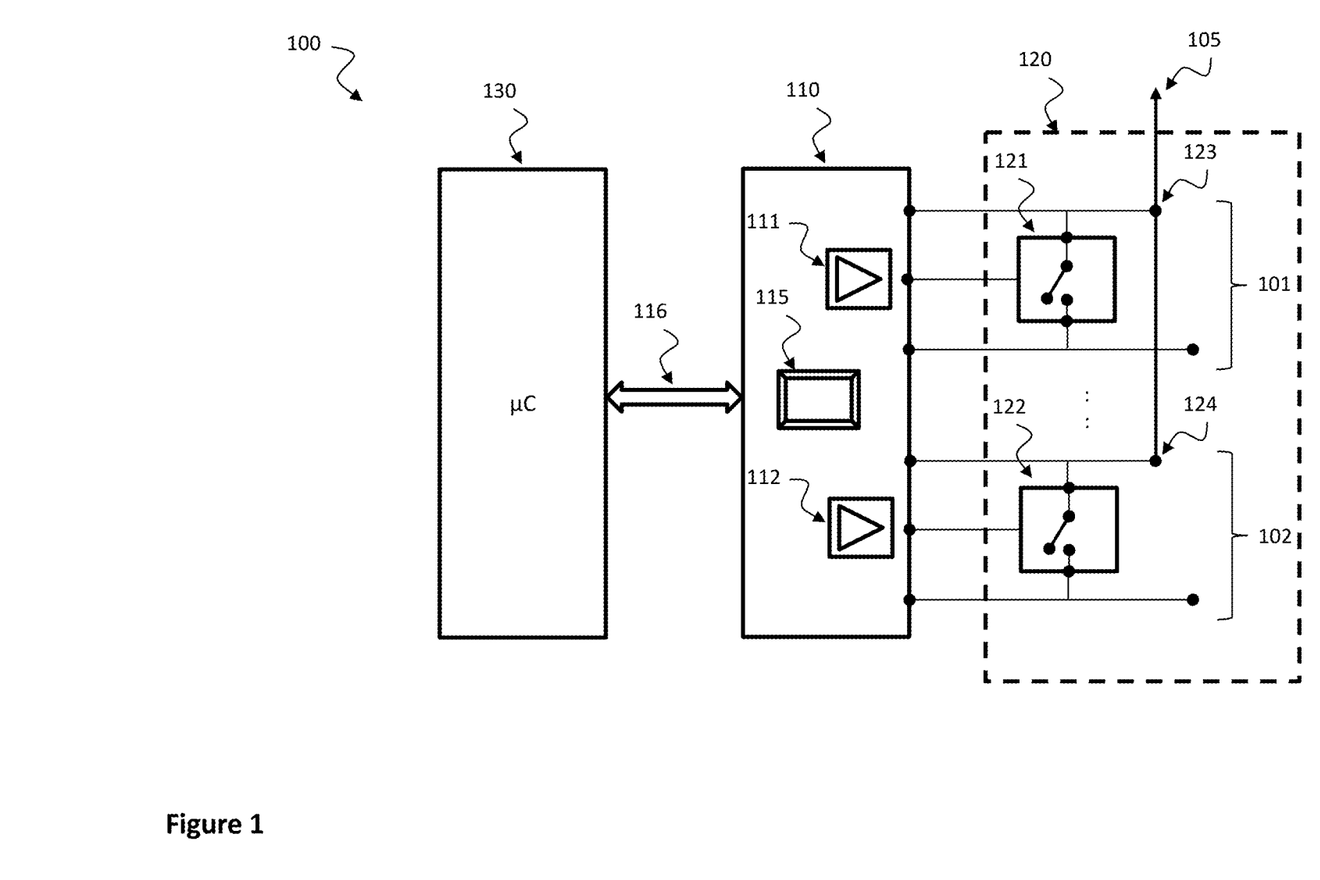
FIG. 1 shows a schematic representation of an electronic power distributor system including an electronic fuse circuit for safeguarding a multi-channel electronic power distributor, according to the teachings of the present disclosure.

FIG. 1 shows a schematic representation of an electronic power distributor system 100 including an electronic fuse circuit 110 for the safeguarding of a multi-channel electronic power distributor 120 according to the disclosure.

The electronic power distributor system 100 comprises an electronic fuse circuit 110, a multi-channel electronic current distributor 120, and a microcontroller 130.

In the representation of FIG. 1, the multi-channel electronic power distributor 120 comprises an exemplary number of two channels 101, 102. Each channel 101, 102 comprises an electronic switch 121, 122 for switching-on or -off of a power supply 105, in one form, of the electrical system at a load path having a load (not shown) such as, in one form, an interior lighting system, a cooling system, a window-raising system, etc. Each channel 101, 102 comprises a voltage supply terminal 123, 124 that is connectable to the current- or voltage-supply 105 in order to supply the load with current. In FIG. 1 an exemplary number of two channels 101, 102 are depicted. Other configurations having different number of channels are of course also realizable, in one form, a configuration having four channels, as depicted, in one form, in FIG. 2, or a configuration having 3, 5, 6, 7, 8 or more channels. It is understood that a configuration of only one channel is realizable, and is included in this disclosure.

The electronic fuse circuit 110 serves for safeguarding the multi-channel electronic power distributor 120. The electronic fuse circuit 110 comprises a driver circuit 111, 112 for each channel 101, 102 of the electronic power distributor 120. The driver circuit 111, 112 is configured to control an electronic switch 121, 122 of a corresponding channel 101, 102 of the electronic power distributor 120 to assume a certain state.

The electronic fuse circuit 110 comprises a microcontroller interface 116 that is configured to receive a command from the microcontroller 130 for setting the state of the electronic switch 121, 122 of a corresponding channel 101, 102 of the electronic power distributor 120.

The driver circuit 111, 112 of the corresponding channel 101, 102 is configured to set the state of the electronic switch 121, 122 of the corresponding channel of the electronic power distributor 120 according to the command from the microcontroller 130.

The electronic fuse circuit 110 further comprises a safety circuit 115 for detecting a malfunction in the microcontroller 130 and/or the electronic power distributor 120.

In the event of a detected malfunction in the microcontroller 130 and/or the power distributor 120, the driver circuit 111, 112 of each channel 101, 102 is configured to set the state of the electronic switch 121, 122 of the corresponding channel 101, 102 of the electronic power distributor 120 in accordance with a channel-specific preconfigured safety state.

This safety state is generally a state wherein the electronic switch of the corresponding channel is switched off and is thus separated from the power supply 105. Under certain circumstances, however, the preconfigured safety state can also be a switched-on state of the electronic switch 121, 122, in one form, in the case of an emergency lighting or a discharging of an emergency call signal.

Figure 2:
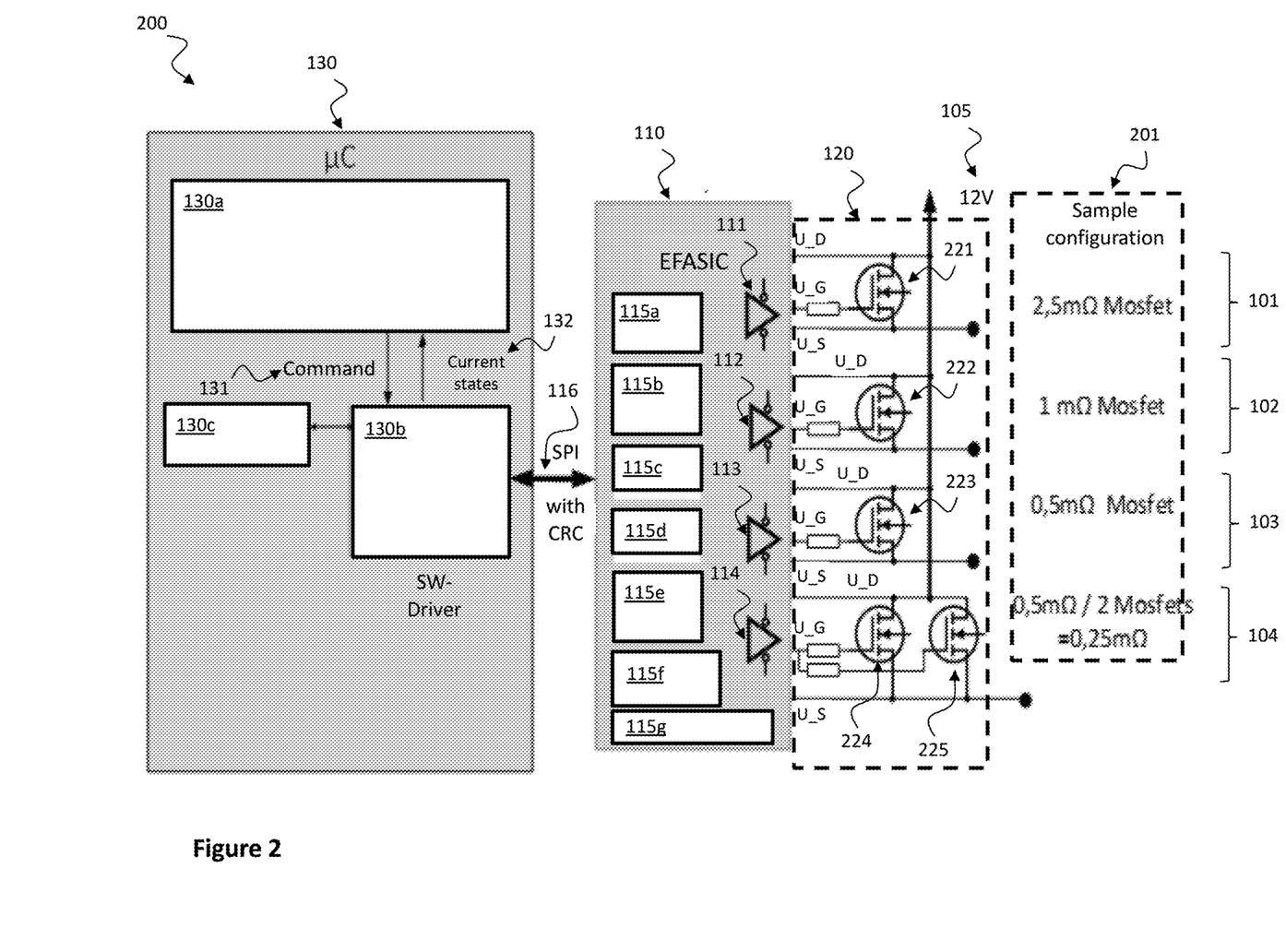
FIG. 2 shows a schematic representation of an electronic power distributor system including the electronic fuse circuit for safeguarding a multi-channel electronic power distributor, according to the teachings of the present disclosure.

The driver circuit 111, 112, 113, 114 of a corresponding channel 101, 102, 103, 104 of the electronic power distributor 120 can be configured, in one form, to control a MOSFET transistor 221, 222, 223, 224, 225 of the corresponding channel 111, 112, 113, 114, as depicted in more detail, in one form, in FIG. 2. In this case the electronic switch 121, 122 can be realized as a MOSFET transistor 221, 222.

In one form, the driver circuit 111 of the first channel 101 of the electronic power distributor 120 can be configured to control a MOSFET transistor 221 of a first type, and the driver circuit 112 of the second channel 102 of the electronic power distributor 120 can be configured to control a MOSFET transistor 222 of a second type.

In one form, the driver circuit 111 of the first channel 101 of the electronic power distributor 120 can be configured to control a first MOSFET transistor 221 that is specified for a first line cross-section of an electrical line of the electronic power distributor 120, and the driver circuit 112 of the second channel 102 of the electronic power distributor 120 can be configured to control a second MOSFET transistor 222 that is specified for a second line cross-section of an electrical line of the electronic power distributor 120.

The safety circuit 115 can comprise a watchdog circuit 115f, as depicted in more detail with respect to FIG. 2, which is configured to detect a malfunction of the microcontroller 130 based on a receiving of vital-sign signals via the microcontroller interface 116 at prescribed temporal intervals.

The driver circuit 111, 112 of the corresponding channel 101, 102 can be configured to determine a transient undervoltage at a voltage supply terminal 123, 124 of the corresponding channel 101, 102 based on a detection of a terminal voltage at the voltage supply terminal 123, 124. The safety circuit 115 can be configured to switch off the electronic switch 121, 122 of the corresponding channel 101, 102 when the terminal voltage is below a first switch-off threshold value.

The driver circuit 111, 112 of the corresponding channel 101, 102 can be configured to receive from the microcontroller 130, via the microcontroller interface 116, a static undervoltage at the voltage supply terminal 123, 124 of the corresponding channel 101, 102 that is determined based on a temporal averaging of the detected terminal voltage. The driver circuit 111, 112 of the corresponding channel 101, 102 can be configured to switch off the MOSFET transistor 221, 222 when the static undervoltage obtained via the microcontroller interface 116 exceeds a second switch-off threshold value.

The driver circuit 111, 112 of the corresponding channel 101, 102 can be configured to transfer the detected terminal voltage at the voltage supply terminal 123, 124 for determining the static undervoltage to the microcontroller 130 via the microcontroller interface 116.

The electronic switch 121, 122 of the corresponding channel 101, 102 can comprise a MOSFET transistor 221, 222, as described in more detail in FIG. 2, in one form. The driver circuit 111, 112 of the corresponding channel 101, 102 can be configured to determine a transient overload in the corresponding channel based on a detection of a differential voltage U_D–U_S of a drain terminal and a source terminal of the MOSFET transistor 221, 22. The safety circuit 115 can be configured to switch off the MOSFET transistor 221, 222, in one form, via controlling of the corresponding driver circuit 111, 112 when the differential voltage exceeds a third switch-off threshold value.

The driver circuit 111, 112 of the corresponding channel 101, 102 can be configured to receive from the microcontroller 130, via the microcontroller interface 116, a static overflow of the corresponding channel that is determined based on an RDSon model of the MOSFET transistor 221, 222. The driver circuit 111, 112 of the corresponding channel 101, 102 can be configured to switch off the MOSFET transistor 221, 222 when the static overcurrent obtained via the microcontroller interface 116 exceeds a fourth switch-off threshold value.

RDSon or $R_{DS(on)}$ is a designation for the switch-on resistance or also a minimum through-resistance of a field-effect transistor, wherein the R stands for the electrical resistance. The index DS stands for the terminal lines of the field-effect transistor that are referred to as drain (D) and source (S). The ON (English for "on") stands for the switched-on state of the field-effect transistor in switching operation.

In the fully connected-through state, the field-effect transistor is low-resistance, values below 1 mΩ can be reached. The minimally achievable switching losses of the transistor can be inferred from the $R_{DS(on)}$. The $R_{DS(on)}$ is usually explicitly specified in data sheets and catalogs as a characteristic value.

Via the $R_{DS(on)}$ the channel current of the MOSFET can be determined from a voltage measurement between the drain and source terminals.

The driver circuit 111, 112 of the corresponding channel 101, 102 can be configured to transfer to the microcontroller 130, via the microcontroller interface 116, the differential voltage U_D–U_S of the drain terminal and of the source terminal of the MOSFET transistor 221, 222 for determining the RDSon model.

The driver circuit 111, 112 of the corresponding channel 101, 102 can be configured to detect a housing temperature of the MOSFET transistor 221, 222 of the corresponding channel 101, 102, and to transfer it to the microcontroller 130, via the microcontroller interface 116, for determining the RDSon model. In one form, the housing temperature can be determined via an NTC resistance that is attached near the housing.

The NTC resistance or heat conductor or NTC thermistor ("negative temperature coefficient thermistor") is a temperature-dependent resistance that has a negative temperature coefficient as an essential property, and conducts electrical current better at high temperatures than at low temperatures. The NTC resistance or resistance thermometer uses the temperature dependence of the electrical resistance of an electrical conductor to measure the temperature.

The electronic fuse circuit 110 can have at least one register 115c for storing the switch-off threshold values, i.e., the above-mentioned first, second, third, and fourth switch-off threshold values. The electronic fuse circuit 110 can be configured to receive the switch-off values via the microcontroller interface 116 and to store them in the at least one register 115c.

The electronic fuse circuit 110 can further include a digital state machine or "state machine" 115b for storing the states of the electronic switches 121, 122 of the respective channels 101, 102 of the electronic power distributor 120. The driver circuit 111, 112 of the corresponding channel 101, 102 can be configured to correspondingly set the digital state machine 115b upon a setting of the state of the electronic switch 121, 122 of the corresponding channel 101, 102.

It is understood that in addition to the states of the electronic switches 121, 122, the digital state machine can also store other states of the corresponding channels 101, 102.

In one form, FIG. 2 shows a schematic representation of an electronic power distributor system 200 including an electronic fuse circuit 110.

The electronic power distributor system 200 is a special configuration of the electronic power distributor system described above for FIG. 1, wherein the electronic switches 121, 122 are configured as MOSFET transistors 221, 222, 223, 224, and wherein the electronic power distributor 120 includes a number of four channels. Furthermore, the MOSFET transistors 221, 222, 223, 224 are specified corresponding to different line cross sections. In this form configuration 201, the MOSFET 221 of the first channel 101 is a 2.5 mΩ MOSFET, the MOSFET 222 of the second channel 102 is a 1 mΩ MOSFET, the MOSFET 223 of the third channel 103 is a 0.5 mΩ MOSFET, and in the fourth channel 104, two parallel-connected MOSFETs 224, 225 are attached that are each 0.5 mΩ MOSFETs, which corresponds to an effective 0.25 mΩ MOSFET.

The source, drain and gate terminals of the respective MOSFET transistors are connected to the driver circuits 111, 112, 113, 114 of the corresponding channels 101, 102, 103, 104 of the electronic fuse circuit 110, so that the respective source- and drain voltages U_S and U_D can be detected by the driver circuits, and the respective gate voltage can be applied by the corresponding driver circuits to the MOSFET-transistors in order to control them or switch them on or off.

In the electronic fuse circuit 110, which is embodied here as EFASIC in one form, the following functionalities are implemented: a gate driver including charge pump or DC/DC converter 115a for gate controlling of the corresponding MOSFETs, a state machine or state machine 115b for storing the respective states of the channels; one or more registers 115c for the configuration and SPI communication, in one form, for the storing of configuration data or other parameters that are received or sent, in one form, via the microcontroller interface 116, an analog-digital converter (ADC) 115d for converting between digital and analog signals, a circuit for rapid switch-off of the electronic switches 115e, a Windows watchdog 115f, and a diagnosis circuit 115g.

The electrical system voltage 105 is, in one form, 12V.

The microcontroller interface 116 is a communications interface for communication to the microcontroller 130, which can be implemented here as SPI. The serial peripheral interface (SPI) is a bus system that represents a standard for a synchronous serial data bus, with which digital circuits can be connected to one another according to the master-slave principle.

The microcontroller 130 comprises one or more software components 130a that communicate with the software driver 130b via commands 131. The software driver comprises an API (application-specific interface) configuration, software-defined characteristics, and a diagnostic tool.

The software driver 130b communicates the current states 132 of the software component 130a. The microcontroller 130 further comprises a watchdog response component 130c that monitors the responses of the software driver 130b in order to monitor the functionality of the software driver 130b.

FIG. 2 thus shows the EFASIC 110 as a mixed-signal front end to a μC 130. The EFASIC 110 typically has 4 channels 101, 102, 103, 104, but can also have 1 to 8 channels. The EFASIC 110 includes analog components, such as, in one form, gate driver and charge pumps (or DC/DC converter) 115a. In addition, it includes a digital state machine 115b with registers 115c for the configuration and SPI communication.

In one form, as shown in FIG. 2, the very efficient functional division is depicted between μC 130 with DSP kernel or ALU, and mixed-signal front end EFASIC 110.

In one form, the base concept is as follows:

All rapid processes run on the EFASIC 110, usually hard-wired, i.e., hardwired. In the event of faults of the μCs 130 or of the peripherals, the EFASIC 110 can autonomously set the preconfigured save state of a channel, i.e., on or off. The EFASIC 110 includes a Windows watchdog 115f in order to detect faults of the μCs 130. The EFASIC 110 has all mechanisms for an ASIL integrity of the switching with safety objective "Provide Supply," "Save State ON." The EFASIC 110 has all mechanisms for an ASIL B integrity of the switching with safety objective "Disconnect Overload," "Save State OFF." The EFASIC 110 has a rapid switch-off in the event of transient overload according to ASIL B. The basis therefor is the measuring of the differential voltage UDS between drain and source. The EFASIC 110 has a rapid switch-off in the event of transient undercurrent according to ASIL B. The basis therefor is the measuring of the terminal 30 voltage, or the terminal to which the grid voltage 105 connects. The EFASIC 110 provides a temperature measurement for each channel. The basis therefor is the voltage NTC near the MOSFET. The EFASIC 110 provides an "inrush" or startup switching for switches in capacitive loads. The EFASIC 110 has an ADC for analog-digital conversion.

All processes containing algorithms run on the µC 130 with DSP kernel or ALU (arithmetic logic unit) and are collected in a complex device driver 130b. These include the following software components or algorithms: calculating the RDSon of the MOSFETs according to a thermal model of the semiconductor. Calculating of the current using the temperature-compensated RDSon. No external shunt is required for this purpose. Calculating of the temperature of the line according to a thermal model of the line, or alternatively calculating the load characteristics and comparing with a fuse characteristic via digital filters. Commanding of the switch-off in the event of static overcurrent. Voltage measurement value treatment via median filters. Commanding of the switch-off in the event of static undervoltage. Writing of configuration parameters in the registers 115c of the EFASIC 110, in one form, of the switch-off thresholds of the overload detection.

For the ASIL B integrity, the following diagnostic mechanisms are implemented in the EFASIC 110: the entire chain of the rapid switch-off, from the UDS measurement, via the comparator via the logic connection, can be diagnosed in the diagnostic mode via switch-off of a reference signal. The measuring of the UDS and temperatures is diagnosed. The function of the state machine 115b is diagnosed. The EFASIC 110 has a gate leakage current measurement that allows the switching ability of the MOSFET to be analyzed.

Figure 3:
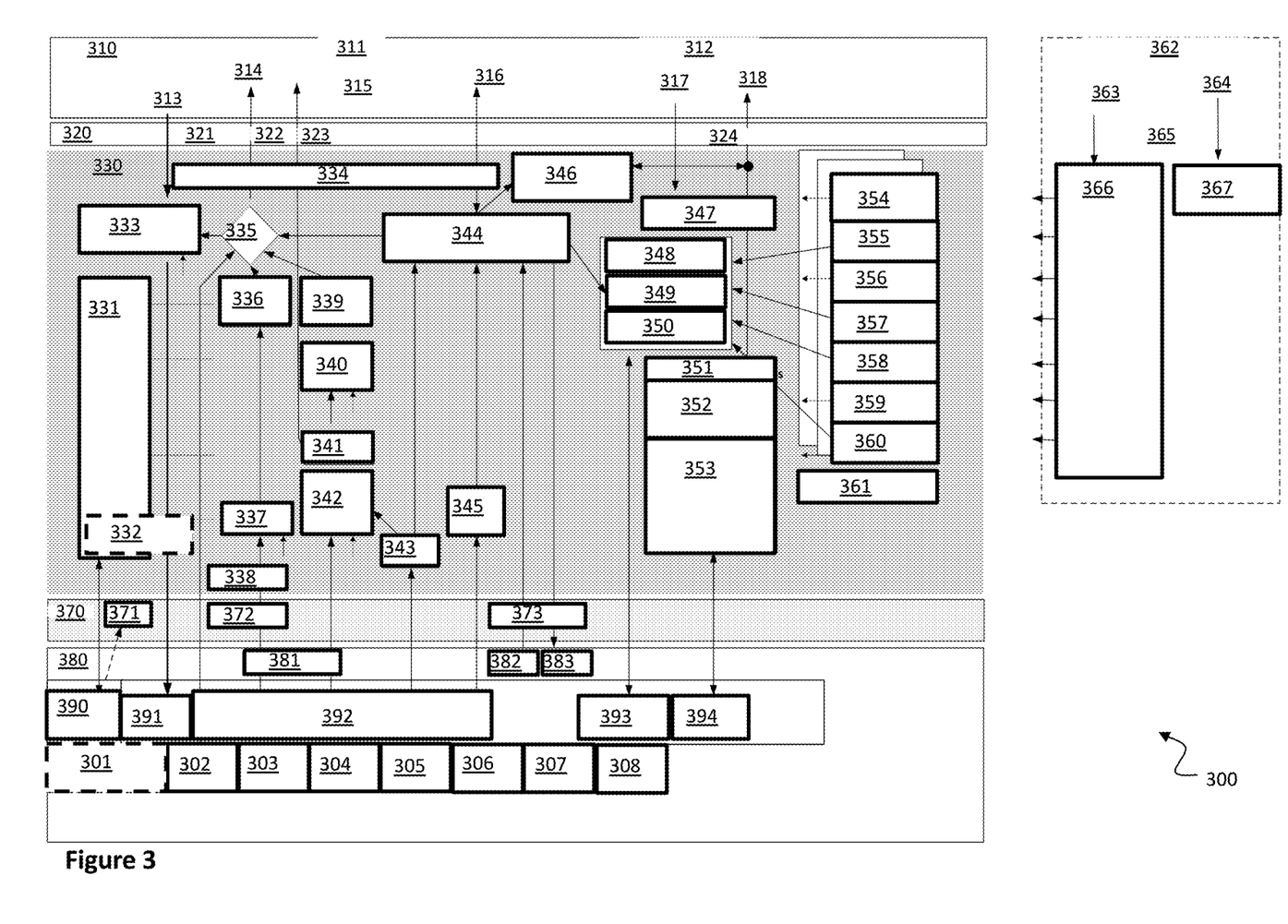
FIG. 3 shows a schematic representation of the architecture of an electronic power distributor system with representation of the software- and hardware-components on the microcontroller and the EFASIC, according to the teachings of the present disclosure.

FIG. 3 shows a schematic representation of the architecture of an electronic power distributor system 300 with representation of the software- and hardware-components on the microcontroller and the EFASIC 110 according to one form.

In this form, the architecture of the software- and hardware-components is implemented according to the AUTOSAR (AUTomotive Open System ARchitecture) standard. The architecture thus provides an open and standardized software architecture for electronic control units (ECUs) that is scalable and can be implemented on different vehicle- and platform-variants in consideration of availability- and safety-requirements.

The software components that can be implemented on the EFASIC 110 according to FIG. 1 or FIG. 2, are depicted in the EFASIC layer 380 and embodied in accordance with the functionality of the EFASIC 110 depicted above with respect to FIG. 2. In the EFASIC layer 380, the communication with the µC 130 is implemented via SPI with CRC (Cyclic Redundancy Check) 381. Furthermore, interrupt 382 and enable (ENA) 383 mechanisms are implemented for communication with the software driver 130b of the microcontroller 130. In the EFASIC layer 380, the following functionalities are furthermore implemented, as already described in more detail above for FIG. 2: watchdog register 390, channel status register 391, channel measurement register 392, channel configuration register 393, diagnostic mode register 394, safe state ON lock and release 301, rapid U_DS switch-off 302, ADC 303, state machine 304, booster 305, internal supply 306, driver states 307, diagnostic references 308.

The software components that can be implemented on the microcontroller 130 according to FIG. 1 or FIG. 2, i.e., on the software driver 130b of the µC 130, as described in more detail with respect to FIG. 2, are represented in the complex device driver for the EFASIC 330, i.e., the software driver 330 of the EFASIC 110 and embodied in accordance with the functionality of the EFASIC 110.

The software driver 330 of the EFASIC comprises a Windows watchdog 331 that communicates with the EFASIC 110 via the software component "safe-state ON lock," i.e., communicates to the watchdog register 390 in order to switch on the safe state. The communication is guided via the MCAL layer 370, wherein an SPI 372 and a GPIO 373 are implemented according to the AUTOSAR standard. The MCAL layer 370 further includes a reset 371 module that is controlled by the watchdog register 390.

The complex device driver for the EFASIC 330 further includes the following software components, as already described in more detail above for FIG. 2: "Soft Terminal to Channel State Mapping" 333, "Time Slice OS trigger (20 ms)" 334, combiner 335, "UV Shut-Off" 336, median filter 337, CRC 338, OL Shut-Off 339, "Wire Characteristic" 340, "Ups→I" 341, temperature compensation, RDSon model 342, "UT→T" 343, diagnostic cycle 344, "t→I_Gate_Leakage" 345, error storage and counter 346, read/reset channel status 347, write configuration set A 348, read configuration set and compare with B 349, repeat B/C when not plausible 350, initializing of the diagnostic 351, testing external devices, gate leakage measurement, gate pull-down diagnostic, LC check 352, test EFASIC function with reference source: ADC U_DS, T check, rapid SC shutoff check state machine check, functional register check, DC booster check 353, line diameter characteristic lookup 354, safety configuration 355, terminal configuration 356, inrush configuration 357, PWM configuration 358, undervoltage configuration 359, rapid shut-down configuration 360, A,B,C configuration sets with plausibility check and repair 361.

The configuration of the complex device driver for the EFASIC 330 is effected via a configuration interface "End-Off Line and/or OTA" 362, using which a "Single Update" 365 can be initiated. Via the configuration interface 362, metadata, i.e., "Write Channel Configuration Metadata" 363 can be entered from outside in order to communicate the following configurations to the complex device driver for the EFASIC 330: line diameter, safe state on/off, terminal association, inrush control (precharge), PWM cycle, undervoltage (threshold, time), channel MOSFET R_DSon 80°, 0°, −40°. A channel measurement calibration 367 is effected via a calibration input 364.

In the application layer 310, the following functionalities are implemented according to AUTOSAR standard: operation/operation 311, initialization phase 312, write soft terminal states 313, receive channel status 314, receive channel measurements 315, receive channel diagnosis results 316, initialize 317, receive system ready signal 318.

Via the RTI-interface 320, according to the AUTOSAR standard the write and read commands can be transmitted cyclically 321, 322, 323 or event-controlled 324 to the complex device driver for the EFASIC 330.

Figure 4:
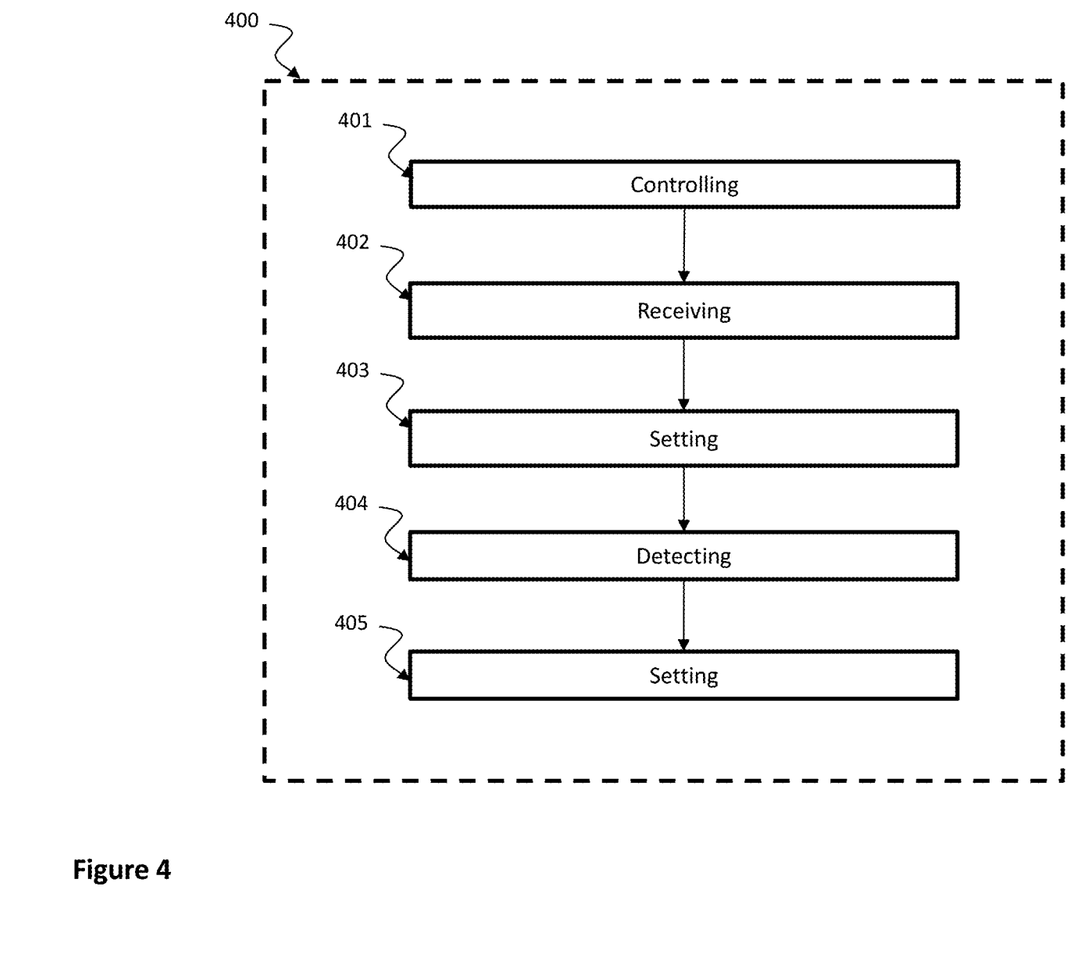
FIG. 4 shows a schematic representation of a method for safeguarding a multi-channel electronic power distributor, according to the teachings of the present disclosure.

FIG. 4 shows a schematic representation of a method 400 for safeguarding a multi-channel electronic power distributor according to the disclosure.

The method 400 serves for safeguarding a multi-channel electronic power distributor 100, 200, 300, as described above, in one form, with reference to FIGS. 1 to 3.

The method 400 comprises a controlling 401 of an electronic switch 121, 122 of a corresponding channel of the electronic power distributor to assume a certain state by a driver circuit 111, 112 for each channel of the electronic power distributor as described above with respect to FIGS. 1 to 3.

The method 400 comprises a receiving 402 of a command from a microcontroller 130, via a microcontroller interface 116, for setting the state of the electronic switch of a corresponding channel of the electronic power distributor, as described above, in one form, with respect to FIGS. 1 to 3.

The method 400 comprises a setting 403 of the state of the electronic switch of the corresponding channel of the electronic power distributor by the driver circuit 111, 112 of the corresponding channel, according to the command of the microcontroller as described above, in one form, with respect to FIGS. 1 to 3.

The method 400 comprises a detecting 404 of a malfunction in the microcontroller 130 and/or the electronic power distributor 120 by a safety circuit 115, as described above, in one form, with respect to FIGS. 1 to 3.

The method 400 comprises a setting 405 of the state of the electronic switch of the corresponding channel of the electronic power distributor by the driver circuit of each channel, according to a channel-specific preconfigured safety state when a malfunction is detected in the microcontroller and/or the power distributor, as described above, in one form, with respect to FIGS. 1 to 3.

Furthermore, a computer program can be provided with a program code for executing the method 400 in a control system, in one form, on an electronic fuse circuit 110 as described above with respect to FIGS. 1 to 3.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In this application, the term "controller" and/or "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components (e.g., op amp circuit integrator as part of the heat flux data module) that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting forms of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. An electronic fuse circuit for safeguarding a multi-channel electronic power distributor, the electronic fuse circuit comprising:
   a driver circuit for each channel of the multi-channel electronic power distributor, wherein the driver circuit is configured to control an electronic switch of a corresponding channel of the multi-channel electronic power distributor to assume a certain state;
   a microcontroller interface configured to receive a command for adjusting a state of the electronic switch of each channel of the multi-channel electronic power distributor from a microcontroller, wherein the driver circuit of the corresponding channel is configured to set the state of the electronic switch of the corresponding channel of the multi-channel electronic power distributor according to the command from the microcontroller;
   and a safety circuit for detecting a malfunction in at least one of the microcontroller and the multi-channel electronic power distributor,
   wherein in response to a detected malfunction in the least one of the microcontroller and the multi-channel electronic power distributor, the driver circuit of each channel is configured to set the state of the electronic switch of the corresponding channel of the multi-channel electronic power distributor according to a channel-specific preconfigured safety state,
   the driver circuit of each channel is configured to determine a transient undervoltage at a voltage supply terminal of the corresponding channel based on a detection of a terminal voltage at the voltage supply terminal, and
   the safety circuit is configured to switch off the electronic switch of the corresponding channel when the terminal voltage falls below a first switch-off threshold value.

2. The electronic fuse circuit according to claim 1, wherein the driver circuit of each channel of the multi-channel electronic power distributor is configured to control a MOSFET transistor as the electronic switch of the corresponding channel.

3. The electronic fuse circuit according to claim 1, wherein:
   the driver circuit of a first channel of the multi-channel electronic power distributor is configured to control a MOSFET transistor of a first type; and
   the driver circuit of a second channel of the multi-channel electronic power distributor is configured to control a MOSFET transistor of a second type.

4. The electronic fuse circuit according to claim 1, wherein:
the driver circuit of a first channel of the multi-channel electronic power distributor is configured to control a first MOSFET transistor that is specified for a first line cross-section of a first electrical line of the multi-channel electronic power distributor or a second line cross-section of a second electrical line of the multi-channel electronic power distributor; and
the driver circuit of a second channel of the multi-channel electronic power distributor is configured to control a second MOSFET transistor that is specified for the first line cross-section of the first electrical line of the multi-channel electronic power distributor or the second line cross-section of the second electrical line of the multi-channel electronic power distributor.

5. The electronic fuse circuit according to claim 1, wherein the safety circuit comprises a watchdog circuit that is configured to detect a malfunction of the microcontroller based on a receiving of vital-sign signals via the microcontroller interface at prescribed temporal intervals.

6. The electronic fuse circuit according to claim 1, wherein:
the driver circuit of each channel is configured to receive from the microcontroller, via the microcontroller interface, a static undervoltage at the voltage supply terminal of the corresponding channel, wherein the static undervoltage is determined based on a temporal averaging of the detected terminal voltage; and
the driver circuit of each channel is configured to switch off the MOSFET transistor electronic switch of the corresponding channel when the static undervoltage obtained via the microcontroller interface exceeds a second switch-off threshold value.

7. The electronic fuse circuit according to claim 6, wherein the driver circuit of each channel is configured to transfer the detected terminal voltage at the voltage supply terminal for determining the static undervoltage to the microcontroller via the microcontroller interface.

8. The electronic fuse circuit according to claim 1, wherein:
the electronic switch of the corresponding channel comprises a MOSFET transistor;
the driver circuit of each channel is configured to determine a transient overload in the corresponding channel based on a detection of a differential voltage of a drain terminal and a source terminal of the MOSFET transistor;
and wherein the safety circuit is configured to switch off the MOSFET transistor when the differential voltage exceeds a third switch-off threshold value.

9. The electronic fuse circuit according to claim 8, wherein:
the driver circuit of each corresponding channel is configured to receive from the microcontroller, via the microcontroller interface, a static overcurrent of the corresponding channel that is determined based on an RDSon model of the MOSFET transistor, and
the driver circuit of each channel is configured to switch off the MOSFET transistor when the static overcurrent obtained via the microcontroller interface exceeds a fourth switch-off threshold value.

10. The electronic fuse circuit according to claim 9, wherein the driver circuit of each channel is configured to transfer the differential voltage of the drain terminal and the source terminal of the MOSFET transistor to the microcontroller, via the microcontroller interface, for determining the RDSon model.

11. The electronic fuse circuit according to claim 9, wherein the driver circuit of each channel is configured to detect a housing temperature of the MOSFET transistor of the corresponding channel, and to transfer it to the microcontroller, via the microcontroller interface, for determining the RDSon model.

12. The electronic fuse circuit according to claim 7, further comprising:
at least one register for storing the switch-off threshold values,
wherein the electronic fuse circuit is configured to receive the switch-off values via the microcontroller interface and to store them in the at least one register.

13. The electronic fuse circuit according to claim 1, further comprising:
a digital state machine for storing the states of the electronic switches of the respective channels of the multi-channel electronic power distributor,
wherein the driver circuit of each channel is configured to correspondingly set the digital state machine upon a setting of the state of the electronic switch of the corresponding channel.

14. A method for safeguarding a multi-channel electronic power distributor, the method comprising:
controlling of an electronic switch for each channel of the multi-channel electronic power distributor to assume a certain state by a driver circuit of a corresponding channel of the multi-channel electronic power distributor;
receiving from a microcontroller, via a microcontroller interface, a command for setting a state of the electronic switch of each channel of the multi-channel electronic power distributor;
setting of the state of the electronic switch of each channel of the multi-channel electronic power distributor by the driver circuit of the corresponding channel, according to the command of the microcontroller;
detecting a malfunction in at least one of the microcontroller and the multi-channel electronic power distributor by a safety circuit;
setting of the state of the electronic switch of each channel of the multi-channel electronic power distributor by the driver circuit of the corresponding channel, according to a channel-specific preconfigured safety state, when the malfunction is detected in the at least one of the microcontroller and the multi-channel electronic power distributor;
determining a transient undervoltage at a voltage supply terminal of each channel based on a detection of a terminal voltage at the voltage supply terminal; and
switching off the electronic switch of the corresponding channel when the terminal voltage falls below a first switch-off threshold value.

* * * * *